United States Patent [19]

Haramoto et al.

[11] 4,137,507
[45] Jan. 30, 1979

[54] PHASE-SHIFTING CIRCUIT

[75] Inventors: Yutaka Haramoto, Zama; Yasuhiko Fujii, Yokohama; Masami Yamazaki, Zama, all of Japan

[73] Assignee: Victor Company of Japan, Ltd., Yokohama, Japan

[21] Appl. No.: 785,213

[22] Filed: Apr. 6, 1977

[30] Foreign Application Priority Data

Apr. 12, 1976 [JP] Japan .................................. 51-41064
Jun. 4, 1976 [JP] Japan .................................. 51-72227

[51] Int. Cl.² .................................................. H03F 3/04
[52] U.S. Cl. ................................. 330/302; 330/107; 330/109
[58] Field of Search ..................... 328/55, 56; 330/107, 330/109, 294, 302

[56] References Cited

U.S. PATENT DOCUMENTS 3,112,451 11/1963 Collins .............................. 330/302 X
3,613,011 10/1971 Wood ................................ 330/109 X

OTHER PUBLICATIONS

Electronics — "24 Active Filters", vol. 42, No. 15, Jul. 21, 1969.

Primary Examiner—Lawrence J. Dahl

[57] ABSTRACT

A phase-shifting circuit comprises a first transistor circuit having a base to which an input signal is applied, first and second resistors of equal resistance values connected mutually in series and between an emitter of the first transistor circuit and ground, a third resistor connected at one terminal thereof to the emitter of the first transistor circuit, a capacitor connected between the other terminal of the third resistor and ground, and a second transistor circuit having a base connected to said other terminal of the third resistor and an emitter connected to the junction between the first and second resistors, an output signal being led out from a collector of the second transistor circuit.

8 Claims, 7 Drawing Figures

PHASE-SHIFTING CIRCUIT

BACKGROUND OF THE INVENTION

The present invention relates generally to phase-shifting circuits and more particularly to phase-shifting circuits capable of being incorporated in a large number in an integrated circuit (IC) package of a limited number of pins.

For the purpose of subjecting an analog signal to a great time delay without waveform distortion, a delay circuit of an organization wherein a required number of phase-shifting circuits of flat frequency response characteristic are connected in cascade connection is used in many cases. These phase-shifting circuits contain capacitors within their circuits.

When phase-shifting circuits of known type are to be formed as an IC, since the capacitors used in the circuits become externally connected, two IC package pins are necessary for external connection of the capacitor of the phase-shifting circuit of each stage. Consequently, in the forming as an IC of a delay circuit comprising a large number of stages of phase-shifting circuits in cascade connection in order to obtain a large delay time, a large number of IC package pins for external connection of the capacitors become necessary.

However, IC packages are standardized by each IC manufacturer, and the arrangements and numbers of pins provided on the IC packages are also substantially standardized. The dual in-line packages (DIPs) widely supplied at present are ordinarily of the 14-pin and 16-pin type, and DIPs of particularly large number of pins are those of 40 pins and 42 pins. Since the numbers of pins of these IC packages are standardized by the manufacturers, and the numbers of pins are predetermined in this manner, the above mentioned delay circuit must be so designed for circuit integration as an IC that the number of pins required for external connection of the capacitors will not exceed the number of pins of the IC package. For this reason, in the case where a delay circuit employing known phase-shifting circuits is to be circuit integrated as an IC, the number of connected stages of the phase-shifting circuits to be connected in cascade connection is subject to limitation, whereby it has been difficult to integrate into an IC a delay circuit comprising a large number of phase-shifting circuits in cascade connection.

SUMMARY OF THE INVENTION

Accordingly, it is a general object of the present invention to provide a novel and useful phase-shifting circuit which does not give rise to the above described difficulty.

Another and specific object of the invention is to provide a phase-shifting circuit of an organization wherein one terminal of the capacitor within the circuit is connected to a reference potential point. By this provision according to the invention, a small number of pins is sufficient in the integration into an IC of a circuit comprising a plurality of the phase-shifting circuits cascade connection in a plurality of stages. Accordingly, an IC package of a delay circuit comprising the phase-shifting circuits cascade connected in a large number of stages and having a large delay time can be readily produced.

Still another object of the invention is to provide a phase-shifting circuit as stated above capable of effectively suppressing particularly harmonics distortion in high-frequency band.

Other objects and further features of the invention will be apparent from the following detailed description with respect to preferred embodiments of the invention when read in conjunction with the accompanying drawings briefly described below.

DETAILED DESCRIPTION

Figure 1:
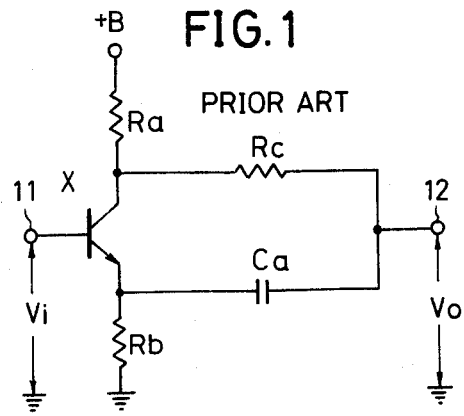
FIG. 1 is a circuit diagram showing the essential organization of one example of a phase-shifting circuit known in the prior art.

A known phase-shifting circuit has a circuit organization as shown in FIG. 1 which comprises a transistor X to the base of which an input signal $Vi$ is applied through an input terminal 11, a collector resistor $Ra$, and emitter resistor $Rb$, a resistor $Rc$ connected between the collector of the transistor X and an output terminal 12, and a capacitor $Ca$ connected between the emitter of the transistor X and the output terminal 12. As is known, the output signal $Vo$ obtained from the output terminal 12 can be expressed by the following Eq.(1).

$$Vo = -\left(\frac{1 - j\omega CaRc}{1 + j\omega CaRc}\right)Vi \tag{1}$$

In the case where this phase-shifting circuit is integrated into an IC package the capacitor $Ca$ becomes externally connected. In this case, since the two terminals of the capacitor $Ca$ are respectively connected to the junction between the emitter of the transistor X and the resistor $Rb$ and to the output terminal 12, two pins are required in the IC package for the external connection of one capacitor $Ca$. Accordingly, in the case where a delay circuit comprising a plurality of this phase-shifting circuit in cascade connection is to be integrated in an IC, IC package pins of a number which is twice the number of connected stages of the phase-shifting circuits are required for the external connections of the capacitors of all phase-shifting circuits. For this reason, the aforedescribed difficulty is encountered.

The present invention, which overcomes this difficulty, will now be described with respect to first through fifth preferred embodiments of the phase-shifting circuit according to the invention with reference to FIGS. 2 through 6. Throughout these figures, like parts are designated by like reference numerals and characters.

Figure 2:
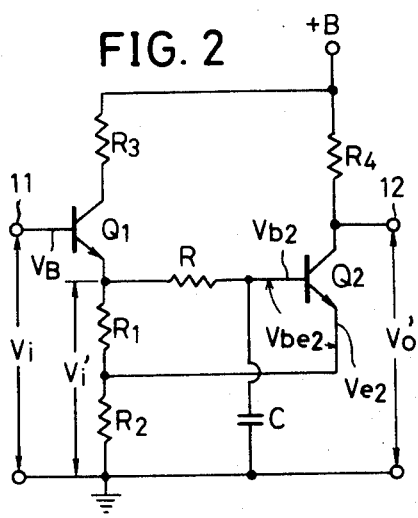
FIGS. 2 through 6 are circuit diagrams respectively showing a first through fifth embodiments of a phase-shifting circuit according to the present invention.

In the phase-shifting circuit shown in FIG. 2 constituting a first embodiment of the invention, an input signal $Vi$ introduced through the input terminal 11 is applied to the base of a transistor Q1. Between the emitter of the transistor Q1 and ground (earth), resistors R1 and R2 of the same resistance value are connected in series connection. The emitter of the transistor Q1 is connected through a resistor R to the base of another transistor Q2. The emitter of the transistor Q2 is connected to the junction between the resistors R1 and R2. A capacitor C is connected between the junction between the resistor R and the base of the transistor Q2 and ground. Collector resistors R3 and R4 are connected respectively between the collectors of the transistors Q1 and Q2 and the power source +B. The collector of the transistor Q2 is connected also to the output terminal 12.

In the phase-shifting circuit of the above described organization, when an input signal V$i$ is applied to the input terminal 11, a signal V$i$ of the relationship V$i \approx$ V$i'$ appears between the emitter of the transistor Q1 and the ground. Between the base of the transistor Q2 and ground, a signal V$b2$ represented by the following Eq.(2) appears.

$$Vb2 = \frac{1}{1 + j\omega CR} Vi' \quad (2)$$

Since the emitter of the transistor Q2 is connected to the junction between the resistors R1 and R2 of each resistance value, a signal V$e2$ appearing between the emitter of the transistor Q2 and ground is one half of V$i'$, that is, V$e2 = \frac{1}{2}$V$i'$.

Accordingly, a signal V$be2$ appearing between the base and emitter of the transistor Q2 is represented by the following Eq.(3).

$$Vbe2 = Vb2 - Ve2 = (\frac{1}{1 + j\omega CR} - \frac{1}{2})Vi'$$
$$= \frac{1}{2}(\frac{1 - j\omega CR}{1 + j\omega CR})Vi' \quad (3)$$

An output signal V$o'$ appearing at the output terminal 12 is represented by the following Eq.(4)

$$Vo' = -\frac{G}{2}(\frac{1 - j\omega CR}{1 + j\omega CR})Vi' \quad (4)$$

where G is the amplification degree of the transistor Q2. Since this amplification degree G can be arbitrarily set, Eq.(4) becomes the following Eq.(5), when G = 2.

$$Vo' = -(\frac{1 - j\omega CR}{1 + j\omega CR})Vi' \quad (5)$$

As is apparent from a comparison of this Eq.(5) and the previous Eq.(1), the phase-shifting circuit shown in FIG. 2 has an input-output characteristic similar to that of the known phase-shifting circuit illustrated in FIG. 1. In the phase-shifting circuit of the invention, moreover, one terminal of the capacitor is connected to the standard potential point (i.e., the ground or earth potential point in the instant embodiment of the invention). For this reason, when this phase-shifting circuit is connected in a plural number of stages in cascade connection, the terminals of the capacitors of all of the phase-shifting circuits on one side can be commonly connected, while the capacitor terminals on the other side may be connected respectively to pins of the IC package. For this reason, the number of pins required for the external connections of the capacitors is substantially equal to the number of capacitors. Therefore, a circuit comprising a large number of phase-shifting circuits in cascade connection can be readily integrated into an IC.

While in the above described embodiment of the invention, the circuit is so arranged that the input signal V$i$ is applied to the base of the transistor Q1, it may be so adapted that the input signal V$i$ is applied to the two terminals of the circuit of the series connection of the resistors R1 and R2. In this case, the required base current is supplied to the base of the transistor Q2.

In order to connect a plural number of the phase-shifting circuits in direct-coupled cascade connection, the constants, operating points, etc., of the various circuit components are so set that the DC base voltage of the transistor Q1 and the DC collector voltage of the transistor Q2 will become equal, and, moreover, the gain of the circuit between the base of the transistor Q1 and the collector of the transistor Q2 will become one (unity).

More specifically, the DC base voltage of the transistor Q1 and the DC collector voltage of the transistor Q2 can be caused to be equal by causing the collector voltage of the transistor Q2 to be higher by the voltage $\Delta V_{BE}$ between the base and emitter of the transistor than the base voltage of the transistor Q2, which is equal to the DC emitter voltage (V$_B - \Delta V_{BE}$) of the transistor Q1, which is lower than the DC base voltage of the transistor Q1 by the voltage $\Delta V_{BE}$ between the base and emitter of the transistor (for example, approximately 0.6 V in the case of a silicon transistor). Furthermore, the gain of the circuit between the base of the transistor Q1 and the collector of the transistor Q2 can be caused to be one (unity) by making the resistance value of the collector resistor R4 of the transistor Q2 equal to the resistance value of the resistor R1 ( = R2).

Then, in the circuit of the first embodiment of the invention as illustrated in FIG. 2, the power supply voltage V$cc$, the DC base voltage V$_B$ of the transistor Q1, and the voltage V$_{BE}$ between the base and emitter thereof are related in the following manner.

$$Vcc = 2V_B - 3\Delta V_{BE} \quad (6)$$

In the case of circuit design with the aim of selecting the above described voltages and gain under this condition, there arises the problem of little freedom in design.

Figure 3:
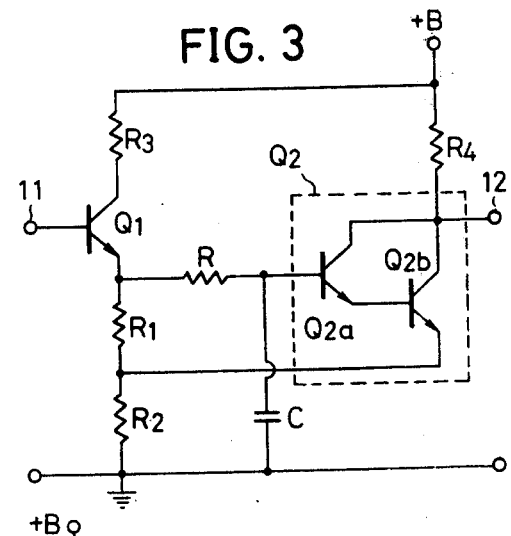

This problem is overcome in another embodiment of a phase-shifting circuit of the invention as illustrated in FIG. 3. In this circuit, two connected transistors Q2$a$ and Q2$b$ are used instead of the transistor Q2 of the first embodiment of the invention illustrated in FIG. 2. The base of the transistor Q2$a$ is connected to the junction between the resistor R and the capacitor C. The base and emitter of the transistor Q2$b$ are respectively connected to the emitter of the transistor Q2$a$ and to the junction between the resistors R1 and R2. The collectors of the transistors Q2$a$ and Q2$b$ are respectively connected commonly to the output terminal 12.

In the general case where the transistor Q2 comprises $m$ ($m = 2$ in the present embodiment of the invention) connected transistors, the relationship between the DC base voltage V$_B$ of the transistor Q1 and the power supply voltage V$cc$ is expressed by the following Eq.(7).

$$Vcc = 2V_B - (2m + 1)\Delta V_{BE} \quad (7)$$

Thus, the voltage values of the DC base voltage V$_B$ of the transistor Q1 and/or the power supply voltage V$cc$ can be changed in conformance with the number $m$ of the connected transistors. For this reason, the voltage values of the DC base voltage V$_B$ of the transistor Q1 and the power supply voltage V$cc$ can be selected at will by appropriately selecting the number $m$ of transistors to be connected, thereby to increase greatly the degree of freedom in the design thereof.

In the circuits of the above described first and second embodiments of the invention, for the purpose of making possible a multiple-stage direct-coupled cascade connection, the voltage between the base and collector of the transistor Q2 is made equal to the voltage $\Delta V_{BE}$ between the base and emitter of the transistor Q1 in orer to make the DC base voltage of the transistor Q1 equal to collector voltage of the transistor Q2. However, when it is desired to operate the transistor Q2 in a state wherein the voltage between its base and collector is high, the circuit organization of a third embodiment of the invention as shown in FIG. 4 is used.

Figure 4:
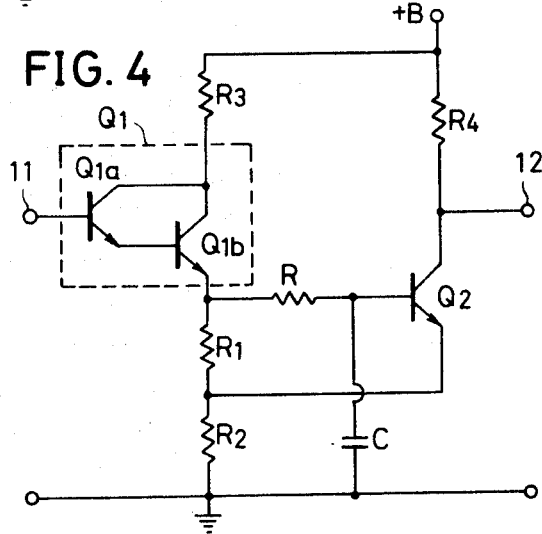

In the circuit shown in FIG. 4, two connected transistors Q1a and Q1b are used in place of the transistor Q1 in the circuit shown in FIG. 2. The base of the transistor Q1a is connected to the input terminal 11. The base and emitter of the transistor Q1b are respectively connected to the emitter of the transistor Q1a and to the junction between the resistors R1 and R. The collectors of the transistors Q1a and Q1b are connected commonly to the resistor R3.

In the general case where the transistor Q1 comprises n (n = 2 in the present embodiment of the invention) connected transistors, the DC collector voltage of the transistor Q2 can be made equal to the base potential of the transistor Q1 by operating the transistor Q2 in a state wherein the voltage between its base and collector is $n\Delta V_{BE}$. In this case, the output saturation voltage of the amplification stage comprising the transistor Q2 becomes higher than those of the circuits of the above described first and second embodiments of the invention.

Figure 5:
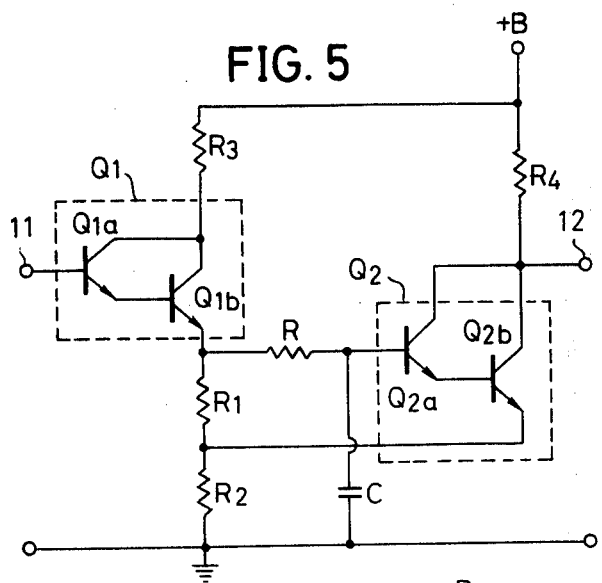

Furthermore, as shown in FIG. 5 illustrating a fourth embodiment of the invention, the transistor Q1 may be constituted by the connected transistors Q1a and Q1b, while the transistor Q2 may be constituted by the connected transistors Q2a and Q2b. Since the operation and functional effectiveness of this circuit can be readily understood from the above description with respect to the second and third embodiments of the invention illustrated in FIGS. 3 and 4, description thereof will be omitted.

In each of the above described embodiments of the invention, with respect to the high-frequency range of a signal, the reactance of the capacitor C becomes low, and the output impedance on the emitter side of the transistor Q2 (the input impedance as considered from the emitter of the transistor Q2) becomes low. As a consequence, the AC load of the transistor Q1 increases in the high-frequency range, whereby the AC operational point of the transistor Q1 varies. For this reason, there arises the problem of an increase in the secondary distortion in the output signal in the high-frequency range.

Figure 6:
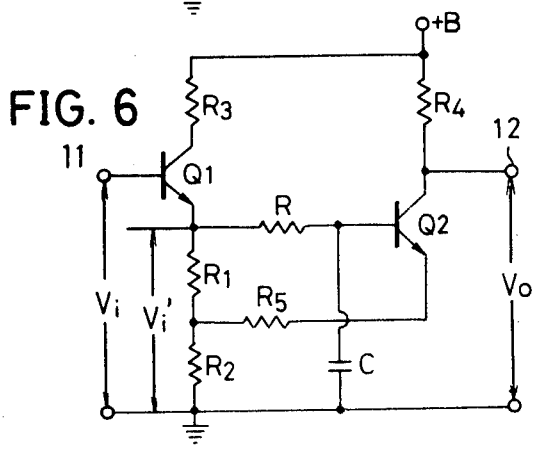

This problem has been solved in an embodiment of the invention illustrated in FIG. 6. In this circuit, a resistor R5 is connected between the junction point between the resistors R1 and R2 and the emitter of the transistor Q2. In all other respects, this circuit is the same as the circuit shown in FIG. 2. This resistor R5 effectively suppresses fluctuations of the AC load of the transistor Q1 even when the reactance of the capacitor C becomes of low value in the high-frequency range. As a result, the harmonic distortion generated in the output signal of the transistor Q1 is reduced.

The resistance value of the resistor R5 is so selected that, even if the value of the capacitor C decreases in the high-frequency range, the value of the AC load of the transistor Q1 will not fluctuate to a degree such as to cause an increase in the harmonic distortion in the output signal. From the viewpoint of suppression of the above mentioned AC load fluctuation of the transistor Q1, the resistance value of the resistor R5 should be made as high as possible, but this resistance value is determined by considering also the gain of the amplification circuit of the transistor Q2.

Although the resistor R5 is connected as described above, the circuit shown in FIG. 6 is a phase-shifting circuit similar to the circuit illustrated in FIG. 2 as described below. The output impedance Z of the resistance circuit network comprising the resistors R5, R1, and R2 is expressed by the following Eq.(8).

$$Z = R_5 + \frac{R_1 \times R_2}{R_1 + R_2} \qquad (8)$$

Here, the base current Ib of the transistor Q2 is expressed in terms of the current amplification factor $h_{fe}$ of the transistor Q2 by the following Eq.(9).

$$Ib = \frac{Vi}{h_{fe} \cdot Z(1 + j\omega CR)} \qquad (9)$$

In the case where it can be considered that the output impedance Z of the above mentioned resistance circuit network connected to the emitter of the transistor Q2 is amply higher than the emitter input impedance of the transistor Q2 as considered from the emitter side, and that the emitter of the transistor Q2 is being driven by a constant current, the emitter current I'e of the transistor Q2 is expressed by the following Eq.(10).

$$I'e = \frac{Vi \cdot R2}{Z(R1 + R2)} \qquad (10)$$

The current Ie which actually flows through the emitter of the transistor Q2 is given by the following Eq.(11).

$$Ie = (h_{fe} \cdot Ib) - I'e$$
$$= \frac{Vi}{Z}[\frac{1}{1 + j\omega CR} - \frac{R2}{R1 + R2}] \qquad (11)$$

Here, since R1 = R2, Eq.(11) becomes as in the following Eq.(12).

$$Ie = \frac{Vi(1 - j\omega CR)}{2Z(1 + j\omega CR)} \qquad (12)$$

Here, when the resistance value of the collector resistor R4 of the transistor Q2 is selected at 2Z, the output signal Vo of the same transistor Q2 is given by the following Eq.(13).

$$Vo = -(\frac{1 - j\omega CR}{1 + j\omega CR})Vi \qquad (13)$$

It is to be observed that Eq.(13) is substantially the same as the previously set forth Eq.(5) and that the circuit shown in FIG. 6 functions as the same phase-shifting circuit as that illustrated in FIG. 2.

Figure 7:
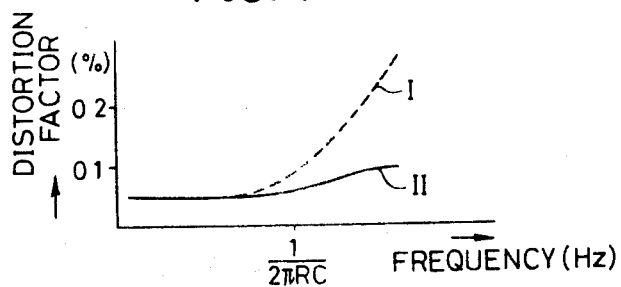
FIG. 7 is a graph indicating a frequency characteristic of distortion factor.

It is to be observed further that, in the circuit of the first embodiment of the invention illustrated in FIG. 2, the distortion in the output signal increases in the high-frequency range as indicated by the broken line I in FIG. 7, whereas in the circuit of the fifth embodiment of the invention shown in FIG. 6, the distortion in the output signal does not increase very much even in the high-frequency range, as indicated by full line II in FIG. 7 because of the existence of the resistor R5.

Further, this invention is not limited to these embodiments but various variations and modifications may be made without departing from the scope and spirit of the invention.

What is claimed is:

1. A phase-shifting circuit comprising: first and second resistors of equal resistance values connected in series, one end of the series connection of the first and second resistors being connected to a reference voltage point, and the other end of the series connection being applied substantially with an input signal; a third resistor connection at one terminal thereof to said other end of the series connection; a capacitor connected between an other terminal of the third resistor and the reference voltage point; and a circuit receiving a first signal voltage obtained from said other terminal of the third resistor and a second signal voltage obtained from the junction between the first and second resistors for producing an output signal which is proportional to a difference voltage between said first and second signal voltages.

2. A phase-shifting circuit as claimed in claim 1 in which the reference voltage point is a ground voltage point.

3. A phase-shifting circuit comprising:
    a first transistor circuit having a base to which an input signal is applied;
    first and second resistors of equal resistance values connected mutually in series and between an emitter of the first transistor circuit and ground;
    a third resistor connected at one terminal thereof to the emitter of the first transistor circuit;
    a capacitor connected between the other end of the third resistor and ground; and
    a second transistor circuit having a base connected to said other end of the third resistor and an emitter connected to the junction between the first and second resistors, an output signal being led out from a collector of the second transistor circuit.

4. A phase-shifting circuit as claimed in claim 3 in which the first transistor circuit comprises a plurality of transistors of successive first through final stages, the emitter of the transistor of each preceding stage being connected to the base of the transistor of the immediately succeeding stage, said input signal being applied to the base of the transistor of the first stage, and the emitter of the transistor of the final stage is connected to the series connection of the first and second resistors.

5. A phase-shifting circuit as claimed in claim 3 in which: the second transistor circuit comprises a plurality of transistors of successive first through final stages, the emitter of the transistor of each preceding stage being connected to the base of the transistor of the immediately succeeding stage; the base of the transistor of the first stage is connected to said other end of the third resistor; and the emitter of the transistor of the final stage is connected to the junction between the first and second resistors.

6. A phase-shifting circuit as claimed in claim 3 in which the first transistor circuit comprises a plurality of transistors of successive first through final stages, the emitter of the transistor of each preceding stage being connected to the base of the transistor of the immediately succeeding stage, said input signal being applied to the base of the transistor of the first stage, and the emitter of the transistor of the final stage is connected to the series connection of the first and second resistors; and the second transistor circuit comprises a plurality of transistors of successive first through final stages, the emitter of the transistor of each preceding stage being connected to the base of the transistor of the immediately succeeding stage; the base of the transistor of the first stage is connected to said other end of the third resistor; and the emitter of the transistor of the final stage is connected to the junction between the first and second resistors.

7. A phase-shifting circuit as claimed in claim 3 in which the base voltage of the first transistor circuit and the collector voltage of the second transistor circuit are selected at a mutually equal value, and the gain of the circuit between a base of the first transistor circuit and a collector of the second transistor circuit is selected at one (unity).

8. A phase-shifting circuit as claimed in claim 3 further comprising a fourth resistor connected between an emitter of the second transistor circuit and the junction between the first and second resistors.

* * * * *